(12) United States Patent
Lee

(10) Patent No.: US 11,038,102 B2
(45) Date of Patent: Jun. 15, 2021

(54) ARTIFICIAL SYNAPSE DEVICE AND METHOD OF MANUFACTURING THE SAME

(71) Applicant: Daegu Gyeongbuk Institute of Science & Technology, Daegu (KR)

(72) Inventor: Myoung Jae Lee, Hwaseong-si (KR)

(73) Assignee: DAEGU GYEONGBUK INSTITUTE OF SCIENCE & TECHNOLOGY, Daegu (KR)

( * ) Notice: Subject to any disclaimer, the term of this patent is extended or adjusted under 35 U.S.C. 154(b) by 256 days.

(21) Appl. No.: 16/255,651

(22) Filed: Jan. 23, 2019

(65) Prior Publication Data

US 2019/0229263 A1 Jul. 25, 2019

(30) Foreign Application Priority Data

Jan. 25, 2018 (KR) ........................ 10-2018-0009652

(51) Int. Cl.
*H01L 29/06* (2006.01)
*H01L 45/00* (2006.01)
*G06N 3/063* (2006.01)

(52) U.S. Cl.
CPC ............ *H01L 45/08* (2013.01); *G06N 3/063* (2013.01); *H01L 45/1266* (2013.01);
(Continued)

(58) Field of Classification Search
CPC ... H01L 45/08; H01L 45/1266; H01L 45/146; H01L 45/1616; H01L 45/1641; G06N 3/063
(Continued)

(56) References Cited

U.S. PATENT DOCUMENTS

2002/0179947 A1* 12/2002 Nasu .................... H01L 28/65
257/295
2004/0224002 A1* 11/2004 Fishman ................ A61N 1/326
424/423
(Continued)

FOREIGN PATENT DOCUMENTS

JP 2002-057297 A 2/2002
KR 10-1537433 B1 7/2015
(Continued)

OTHER PUBLICATIONS

Yong Hee Kim, Ho Koo, Min Sun Kim, Sang-Don Jung, "Iridium oxide on indium-tin oxide nanowires: An all metal oxide heterostructured multi-electrode array for neuronal interfacing", 2018, Sensors & Actuators: B Chemical Journal, Chemical 273: vol. 273, pp. 718-725. (Year: 2018).*
(Continued)

*Primary Examiner* — Viet Q Nguyen
(74) *Attorney, Agent, or Firm* — Harness, Dickey & Pierce, P.L.C.

(57) ABSTRACT

Disclosed herein is a method of manufacturing an artificial synapse device, which includes forming a first electrode on a substrate, forming a first resistance change layer on the first electrode, and forming an iridium (Ir) electrode on the first resistance change layer. In the case where an artificial synapse device is manufactured by the method of manufacturing an artificial synapse device, it is possible to enhance the reliability of the artificial synapse device by reducing the resistance distribution of the artificial synapse device manufactured by forming oxygen vacancies instead of filaments.

16 Claims, 14 Drawing Sheets

(52) U.S. Cl.
CPC ........ *H01L 45/146* (2013.01); *H01L 45/1616* (2013.01); *H01L 45/1641* (2013.01)

(58) Field of Classification Search
USPC .......................................................... 706/33
See application file for complete search history.

(56) References Cited

U.S. PATENT DOCUMENTS

| | | | | |
|---|---|---|---|---|
| 2009/0283726 | A1* | 11/2009 | Mizoguchi | A61K 8/30 252/582 |
| 2010/0207094 | A1* | 8/2010 | Kanzawa | H01L 27/101 257/4 |
| 2011/0044088 | A1* | 2/2011 | Muraoka | H01L 45/1233 365/148 |
| 2012/0256156 | A1* | 10/2012 | Arita | H01L 45/08 257/4 |
| 2012/0330274 | A1* | 12/2012 | Hyde | A61B 17/435 604/503 |
| 2013/0015423 | A1* | 1/2013 | Mikawa | H01L 45/08 257/4 |
| 2013/0112935 | A1* | 5/2013 | Himeno | H01L 45/16 257/4 |
| 2013/0224931 | A1* | 8/2013 | Sorada | H01L 27/2409 438/382 |
| 2014/0015548 | A1* | 1/2014 | Naughton | G01N 27/3278 324/658 |
| 2014/0061573 | A1* | 3/2014 | Mikawa | H01L 45/1253 257/4 |
| 2014/0326482 | A1* | 11/2014 | Thanawala | C23C 14/3485 174/126.2 |
| 2015/0200363 | A1* | 7/2015 | Sacchetto | G11C 11/56 365/148 |
| 2016/0066789 | A1* | 3/2016 | Rogers | A61N 1/05 604/20 |
| 2016/0076134 | A1* | 3/2016 | Tokunaga | C23C 14/08 428/446 |
| 2018/0351095 | A1* | 12/2018 | Bhaskaran | H01L 45/08 |
| 2020/0227635 | A1* | 7/2020 | Yang | H01L 45/1233 |

FOREIGN PATENT DOCUMENTS

| | | |
|---|---|---|
| KR | 10-2015-0130113 A | 11/2015 |
| KR | 10-1588980 B1 | 1/2016 |

OTHER PUBLICATIONS

Slavcheva, Evelina & Vitushinsky, R. & Mokwa, W. & Schnakenberg, U.. (2004). Sputtered Iridium Oxide Films as Charge Injection Material for Functional Electrostimulation. Journal of The Electrochemical Society. 151. E226-E237. 10.1149/1.1747881. (Year: 2004).*

Shady Gawad et al, "Substrate arrays of iridium oxide microelectrodes for in vitro neuronal interfacing", Jan. 2009, Original Research Article, Frontiers in Neuroengineeering, doi:10.3389/neuro.16.001. 2009, vol. 2, Article 1, pp. 1-7 (Year: 2009).*

Kevin Wang et al, "Flexible Nerve Stimulation Electrode with Iridium Oxide Sputtered on Liquid Crystal Polymer", Jan. 2009, IEEE Trans Biomed Engineering, vol. 56(1) : 6-14, pp. 1-15. (Year: 2009).*

* cited by examiner

ARTIFICIAL SYNAPSE DEVICE AND METHOD OF MANUFACTURING THE SAME

CROSS-REFERENCE TO RELATED APPLICATION

This application claims priority to and the benefit of Korean Patent Application No. 10-2018-0009652, filed on Jan. 25, 2018, the disclosure of which is incorporated herein by reference in its entirety.

BACKGROUND OF THE INVENTION

Field of the Invention

The present invention relates to a method of manufacturing an artificial synapse device, and more particularly, to a method of manufacturing an artificial synapse device using oxygen gas.

Description of the Related Art

An attempt to link brain information processing with computer science has been leading to advances in neurocomputing as well as advances in neuromorphic engineering based on integrated circuit technology to implement neural information processing of the brain and sensory-motor nervous system in hardware.

The brain mimicking technology of the conventional neuromorphic engineering has been developed based on complementary metal-oxide semiconductors (CMOSs). In the case of CMOSs, the growth of research and development was slow for a while due to the limit of integration, but the second growth period has come after the register-structured devices capable of simultaneously performing memory and switching were interpreted.

However, artificial intelligence technologies, such as CPUs, GPUs (SRAMs), big data, and deep learning which are based on the CMOSs, are disadvantageous in that they require huge power consumption. As a representative example, AlphaGo uses 1202 CPUs and 176 GPUs to require an energy consumption of about 3000 MJ a day, which consumes a lot of energy when compared to the energy consumption of 20 watts per hour in the brain.

Accordingly, it is required to study a synapse mimicking device capable of simultaneously performing memory and switching at low energy consumption. To this end, artificial synapse devices using metal oxides have been developed as substitutes for the conventional artificial synapse devices using semiconductors, but there is a problem in that the reliability of the devices is low.

CITATION LIST

Patent Literature

Patent Literature 1: Korean Patent No. 10-1537433

SUMMARY OF THE INVENTION

It is an object of the present invention to provide a method of manufacturing an artificial synapse device for enhancing device reliability.

The present invention is not limited to the above-mentioned object, and other objects of the present invention can be clearly understood by those skilled in the art to which the present invention pertains from the following description.

To accomplish the above object, in accordance with one aspect of the present invention, there is provided a method of manufacturing an artificial synapse device.

The method of manufacturing an artificial synapse device may include forming a first electrode on a substrate, forming a first resistance change layer on the first electrode, forming an upper region of the first resistance change layer as a second resistance change layer by oxygen plasma treatment on the first resistance change layer, and forming an iridium (Ir) electrode on the second resistance change layer.

In this case, the surface roughness of the first resistance change layer and second resistance change layer is reduced by the oxygen plasma treatment.

An artificial synapse device may be supplied with oxygen ions by the small amount of oxygen gas during the formation of the iridium electrode.

The forming an iridium electrode may be performed by mixing argon gas with oxygen gas, the partial pressure of which to be 0.1% to 5%.

The forming a first electrode may be performed by chemical vapor deposition, thermal vacuum treatment, sputtering, or electron beam treatment.

The first electrode may include platinum (Pt) or tungsten (W).

The forming a first resistance change layer may be performed by chemical vapor deposition, thermal vacuum treatment, sputtering, or electron beam treatment.

The first resistance change layer may include $TiO_2$, $NiO$, $Nb_2O_6$, $HfO_2$, $Al_2O_3$, $V_2O_5$, or $TaO_{2-a}$.

In this case, a is 0 (zero) to 2.

When the first resistance change layer is $TaO_{2-a}$, the second resistance change layer may be $Ta_2O_{5-a}$.

In this case, a is 0 (zero) to 2.

The forming a second resistance change layer may be performed by mixing argon gas with oxygen gas, the partial pressure of which to be 1% to 5%.

The method may further include forming a tunneling barrier layer on the first electrode between the forming a first electrode on a substrate and the forming a first resistance change layer on the first electrode.

The forming a tunneling barrier layer may be performed by chemical vapor deposition, thermal vacuum treatment, sputtering, or electron beam treatment.

The tunneling barrier layer may include $TiO_x$, $Ti_xO_y$, $HfO_x$, $Hf_xO_y$, $AlO_x$, $Al_xO_y$, $TaO_x$, $Ta_xO_y$, $VO_x$, $V_xO_y$, $Nb_xO_y$, $NbO_x$, $Fe_xO_y$, $FeO_x$, $W_xO_y$, or $WO_x$.

In this case, each of x and y is a real number greater than 0 (zero).

In the forming an iridium electrode, oxygen ions supplied by the oxygen gas may change resistance values of the first resistance change layer and second resistance change layer while migrating therebetween according to the voltage or current applied thereto.

To accomplish the above object, in accordance with another aspect of the present invention, there is provided an artificial synapse device manufactured by the method of manufacturing an artificial synapse device.

To accomplish the above object, in accordance with a further aspect of the present invention, there is provided a method of manufacturing an artificial synapse device. The method of manufacturing an artificial synapse device may include forming a first electrode on a substrate, forming a resistance change layer on the first electrode, and forming an iridium (Ir) electrode on the resistance change layer by sputtering in an atmosphere of argon gas and a small amount of oxygen gas, wherein the forming an iridium electrode is performed by mixing argon gas with oxygen gas, the partial pressure of which to be 0.1% to 5%.

The resistance change layer may include a metal oxide. The metal oxide of the resistance change layer may include $TiO_2$, $NiO$, $Nb_2O_6$, $HfO_2$, $Al_2O_3$, $V_2O_5$, or $TaO_{2-a}$, where a is 0 (zero) to 2.

BRIEF DESCRIPTION OF THE DRAWINGS

FIG. 2A is a view illustrating a conventional artificial synapse device.

FIG. 2B is a view illustrating an artificial synapse device according to an embodiment of the present invention.

FIG. 2C is a graph illustrating resistance characteristics of the conventional artificial synapse device.

FIG. 2D is a graph illustrating resistance characteristics of the artificial synapse device according to the embodiment of the present invention.

FIG. 2E is a current graph according to the repeated operation of the conventional artificial synapse device.

FIG. 2F is a current graph according to the repeated operation of the artificial synapse device according to the embodiment of the present invention.

FIG. 3A is a schematic view illustrating an artificial synapse device in which the ratio of its first resistance change layer to its second resistance change layer is 3:1 according to an embodiment of the present invention.

FIG. 3B is an SEM photograph illustrating the artificial synapse device in which the ratio of the first resistance change layer to the second resistance change layer is 3:1 according to the embodiment of the present invention.

FIG. 3C is a schematic view illustrating an artificial synapse device in which the ratio of its first resistance change layer to its second resistance change layer is 1:1 according to an embodiment of the present invention.

FIG. 3D is an SEM photograph illustrating the artificial synapse device in which the ratio of the first resistance change layer to the second resistance change layer is 1:1 according to the embodiment of the present invention.

FIG. 4A is a voltage-current graph according to the number of times of voltage application.

FIG. 4B is a voltage-current graph according to the number of times of voltage application.

FIG. 4C is a voltage-current graph of the artificial synapse device according to the ratio of the first resistance change layer and the second resistance change layer.

FIG. 4D is a resistance change graph according to the number of cycles.

FIG. 5A is a TEM photograph for each voltage of the artificial synapse device according to the embodiment of the present invention.

FIG. 5B is a TEM photograph for each voltage application time of the artificial synapse device according to the embodiment of the present invention.

FIG. 5C is a TEM photograph illustrating a reset position (B) of the first resistance change layer and a reset position (A) of the second resistance change layer in the artificial synapse device according to the embodiment of the present invention.

FIG. 5D is a TEM photograph illustrating a set position (B) of the first resistance change layer and a set position (A) of the second resistance change layer in the artificial synapse device according to the embodiment of the present invention.

FIG. 5E is a graph illustrating a measured band gap of the second resistance change layer in the set or reset state of the second resistance change layer of the artificial synapse device according to the embodiment of the present invention.

FIG. 5F is a graph illustrating a measured band gap of the second resistance change layer in the set or reset state of the first resistance change layer of the artificial synapse device according to the embodiment of the present invention.

FIG. 6A is a graph illustrating a variation in current according to the number of times of repeated operation under a set condition of −3 V and 100 ns and a reset condition of 100 ns and different voltages in the artificial synapse device according to the embodiment of the present invention.

FIG. 6B is a graph illustrating a variation in current according to the number of times of repeated operation under a set condition of −3 V and 100 ns and a reset condition of +4.2 V and different reset times in the artificial synapse device according to the embodiment of the present invention.

FIG. 6C is a graph illustrating repetitive implementation characteristics of the artificial synapse device according to the embodiment of the present invention.

DETAILED DESCRIPTION OF THE PREFERRED EMBODIMENTS

Figure 1:
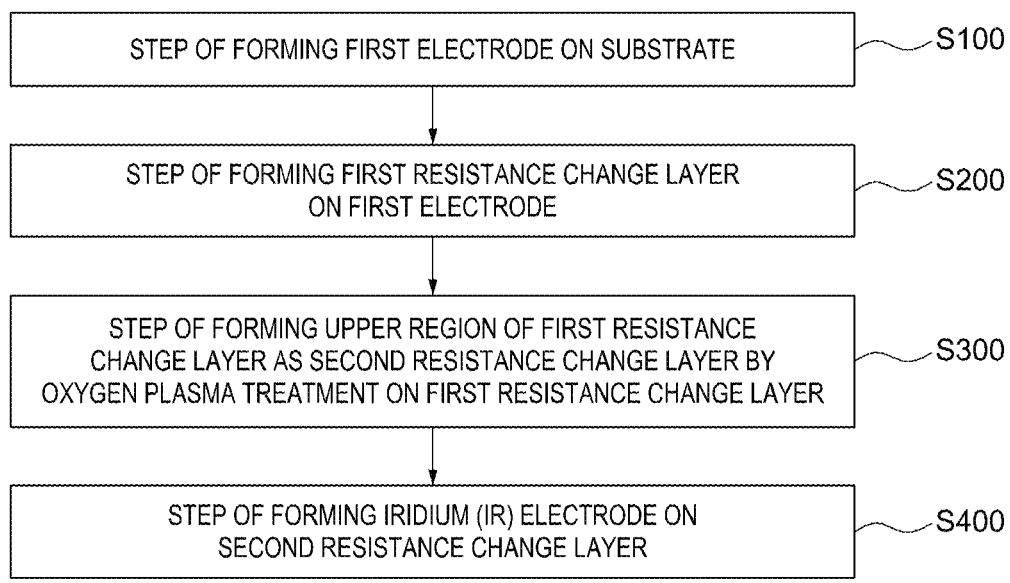
FIG. 1 is a flowchart illustrating a method of manufacturing an artificial synapse device according to an embodiment of the present invention.

Reference will now be made in detail to exemplary embodiments of the present invention, examples of which are illustrated in the accompanying drawings. The present invention may, however, be embodied in different forms and should not be construed as limited to the embodiments set forth herein. For clear explanation of the present invention, parts irrelevant to the description may be omitted in the drawings, and like reference numerals refer to like parts throughout the specification.

In the whole specification, it will be understood that when an element is referred to as being "connected (joined, contacted, or coupled)" to another element, it can be "directly connected" to the other element or it can be "indirectly connected" to the other element with other elements being interposed therebetween. In addition, it will be understood that when a component is referred to as "comprising or including" any component, it does not exclude other components, but can further comprise or include the other components unless otherwise specified.

The terminology used in the present disclosure is for the purpose of describing particular embodiments only and is not intended to limit the invention. As used in the disclosure and the appended claims, the singular forms "a", "an" and "the" are intended to include the plural forms as well, unless context clearly indicates otherwise. It will be further understood that the terms "comprises/includes" and/or "comprising/including" when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, exemplary embodiments of the present invention will be described in detail with reference to the accompanying drawings.

A method of manufacturing an artificial synapse device according to an embodiment of the present invention will be described.

FIG. 1 is a flowchart illustrating a method of manufacturing an artificial synapse device according to an embodiment of the present invention.

Referring to FIG. 1, the method of manufacturing an artificial synapse device may include a step of forming a first electrode on a substrate (S100), a step of forming a first resistance change layer on the first electrode (S200), a step of forming an upper region of the first resistance change layer as a second resistance change layer by oxygen plasma treatment on the first resistance change layer (S300), and a step of forming an iridium (Ir) electrode on the second resistance change layer by sputtering in an atmosphere of argon gas and a small amount of oxygen gas (S400).

In this case, the artificial synapse device is characterized in that it is supplied with oxygen ions ($O^{2-}$) by the small amount of oxygen gas during the formation of the iridium electrode.

It is possible to perform an artificial synapse device role in such a manner that the oxygen ions ($O^{2-}$) supplied by the small amount of oxygen gas during the formation of the iridium electrode change resistance values of the first resistance change layer and second resistance change layer while migrating therebetween according to the voltage or current applied thereto.

It is possible to perform an artificial synapse device role in such a manner that oxygen vacancies migrate in the first resistance change layer or second resistance change layer according to the voltage or current applied to the artificial synapse device and change their resistance values.

In the step of forming an upper region of the first resistance change layer as a second resistance change layer (S300), the oxygen plasma treatment is performed on the first resistance change layer. Therefore, it is possible to improve the surface uniformity of the second resistance change layer by reducing the surface roughness thereof.

In this case, when the surface uniformity of the second resistance change layer is improved, the number of generated filaments may be reduced. Since the presence of a large number of filaments in the artificial synapse device results in a large resistance distribution, a reduction in the number of generated filaments may bring about a reduction in resistance distribution.

If the resistance distribution is reduced in the artificial synapse device, the reliability of the device is enhanced. Therefore, when the second resistance change layer is formed by the oxygen plasma treatment according to the embodiment of the present invention, it is possible to improve the reliability of the device.

In this case, it is possible to enhance the reliability of the artificial synapse device by reducing the resistance distribution of the artificial synapse device.

The presence of impurities between interfaces at the time of forming the artificial synapse device may cause an increase in resistance distribution. Accordingly, there is required a process for removing such a small amount of impurities. To this end, impurities have been removed by oxygen plasma treatment in the conventional semiconductor forming process. By application of this principle, it is possible to mix a small amount of oxygen gas during the formation of the iridium electrode and remove impurities using the oxygen gas in the embodiment of the present invention.

Preferably, the step of forming an iridium electrode (S400) is characterized in that it is performed by mixing argon gas with oxygen gas, the partial pressure of which to be 0.1% to 5%.

If the partial pressure of oxygen gas is set to be less than 0.1% in the argon gas in the step of forming an iridium electrode (S400), the impurities on the second resistance change layer may not be removed due to the low concentration of oxygen gas.

If the partial pressure of oxygen gas is set to be more than 5% in the argon gas in the step of forming an iridium electrode (S400), an iridium oxide layer may be deposited due to the high concentration of oxygen gas instead of removing impurities from the second resistance change layer.

More preferably, the step of forming an iridium electrode (S400) is characterized in that it is performed by mixing argon gas with oxygen gas, the partial pressure of which to be 2% to 3%.

In this case, the step of forming an iridium electrode (S400) may be performed to remove impurities remaining on the second resistance change layer having iridium to be formed thereon by adding a very small amount of oxygen during the formation of the iridium electrode. For example, these impurities may contain carbon.

In the step of forming an iridium electrode (S400), it is possible to reduce the resistance distribution of the artificial synapse device by removing impurities using a small amount of oxygen gas.

Therefore, it is possible to enhance the reliability of the artificial synapse device by reducing the resistance distribution thereof.

The step of forming a first electrode (S100) may be performed by chemical vapor deposition, thermal vacuum treatment, sputtering, or electron beam treatment.

For example, the first electrode may include platinum (Pt) or tungsten (W).

The step of forming a first resistance change layer (S200) may be performed by chemical vapor deposition, thermal vacuum treatment, sputtering, or electron beam treatment.

For example, the first resistance change layer may include $TiO_2$, $NiO$, $Nb_2O_6$, $HfO_2$, $Al_2O_3$, $V_2O_5$, or $TaO_{2-a}$.

In this case, it is characterized in that "a" is 0 (zero) to 2.

When the first resistance change layer is $TaO_{2-a}$, the second resistance change layer is $Ta_2O_{5-a}$.

In this case, it is characterized in that "a" is 0 (zero) to 2.

Preferably, the step of forming a second resistance change layer (S300) may be performed by mixing argon gas with oxygen gas, the partial pressure of which to be 1% to 5%.

The method may further include a step of forming a tunneling barrier layer on the first electrode (not shown)

between the step of forming a first electrode on a substrate (S100) and the step of forming a first resistance change layer on the first electrode (S200).

In this case, the step of forming a tunneling barrier layer (not shown) is characterized in that it is performed by chemical vapor deposition, thermal vacuum treatment, sputtering, or electron beam treatment.

For example, the tunneling barrier layer may include $TiO_x$, $Ti_xO_y$, $HfO_x$, $Hf_xO_y$, $AlO_x$, $Al_xO_y$, $TaO_x$, $Ta_xO_y$, $VO_x$, $V_xO_y$, $Nb_xO_y$, $NbO_x$, $Fe_xO_y$, $FeO_x$, $W_xO_y$, or $WO_x$.

In this case, it is characterized in that each of "x" and "y" is a real number greater than 0 (zero).

Example

An artificial synapse device is manufactured according to an embodiment of the present invention.

First, a platinum electrode is formed on a substrate by sputtering.

Next, an $Al_2O_3$ layer is formed on the platinum electrode by sputtering.

Next, a $TaO_2$ layer is formed on the $Al_2O_3$ layer by sputtering.

Next, a $Ta_2O_5$ layer is formed on the $TaO_2$ layer by oxygen plasma treatment. In this case, the oxygen plasma treatment is performed so that the partial pressure of oxygen gas ($O_2$) is 3% in argon (Ar) gas.

Next, an iridium (Ir) electrode is formed on the $Ta_2O_5$ layer by sputtering.

In this case, the iridium electrode is formed and at the same time the surface of the $TaO_2$ layer is oxidized by oxygen gas so that the $Ta_2O_5$ layer is formed between the $TaO_2$ layer and the iridium electrode.

In the case where an artificial synapse device is manufactured by the method of manufacturing an artificial synapse device according to the embodiment of the present invention, it is possible to enhance the reliability of the artificial synapse device by reducing the resistance distribution of the artificial synapse device manufactured by forming oxygen vacancies instead of filaments.

In the case where an artificial synapse device is manufactured by the method of manufacturing an artificial synapse device according to the embodiment of the present invention, it is possible to provide the artificial synapse device having a multiple resistance value through migration of oxygen ions.

An artificial synapse device manufactured by the method of manufacturing an artificial synapse device according to the embodiment of the present invention will be described.

The artificial synapse device may include a first electrode, a first resistance change layer disposed on the first electrode, a second resistance change layer disposed on the first resistance change layer, and an iridium (Ir) electrode disposed on the second resistance change layer.

The iridium electrode of the artificial synapse device is characterized in that it is formed in an atmosphere of argon gas containing a small amount of oxygen gas.

The resistance change layer of the artificial synapse device is characterized in that it is supplied with oxygen ions ($O^{2-}$) by the small amount of oxygen gas used when the iridium electrode is formed.

The resistance change layer of the artificial synapse device is characterized in that the oxygen ions ($O^{2-}$) supplied by the small amount of oxygen gas used during the formation of the iridium electrode exhibit a multiple resistance value while migrating between the first resistance change layer and the second resistance change layer according to the voltage or current applied thereto.

FIGS. 2A to 2F are comparative views of a conventional artificial synapse device with an artificial synapse device according to an embodiment of the present invention.

Figure 2A:
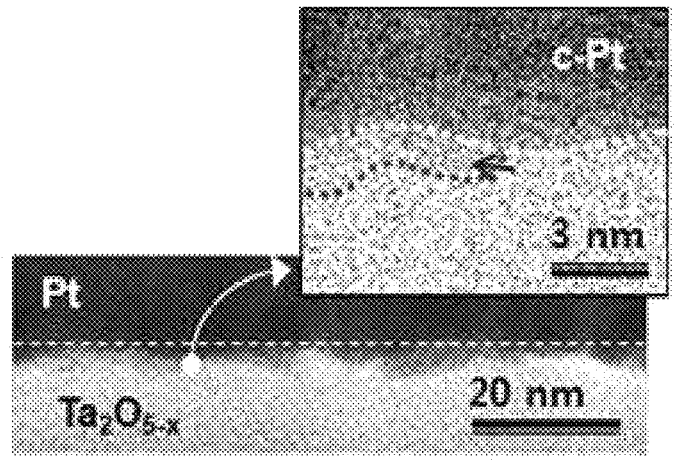
FIGS. 2A to 2F are comparative views of a conventional artificial synapse device with an artificial synapse device according to an embodiment of the present invention.
Figure 2B:
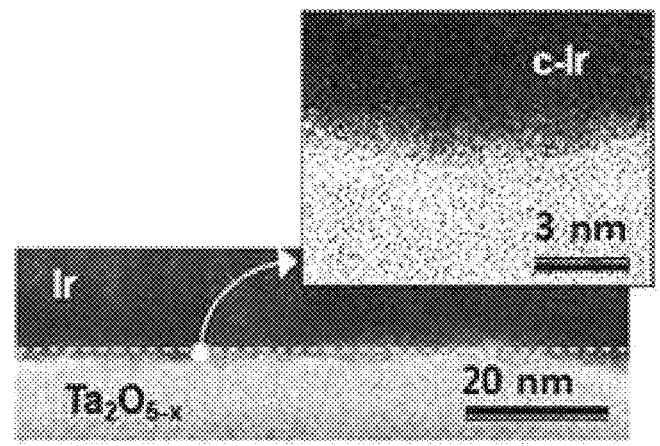
Figure 2C:
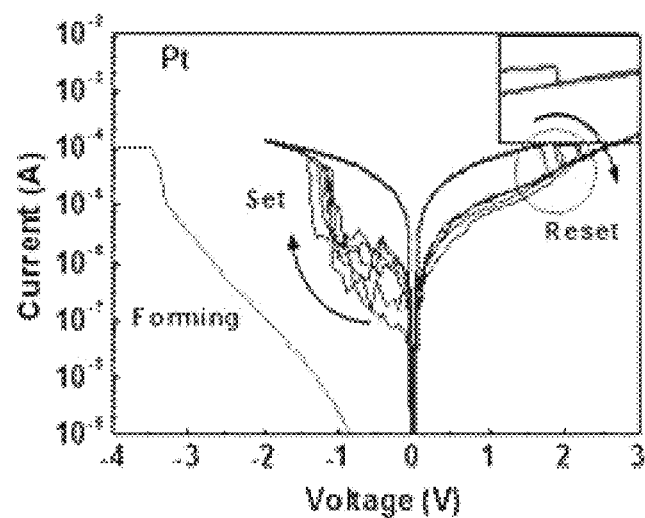
Figure 2D:
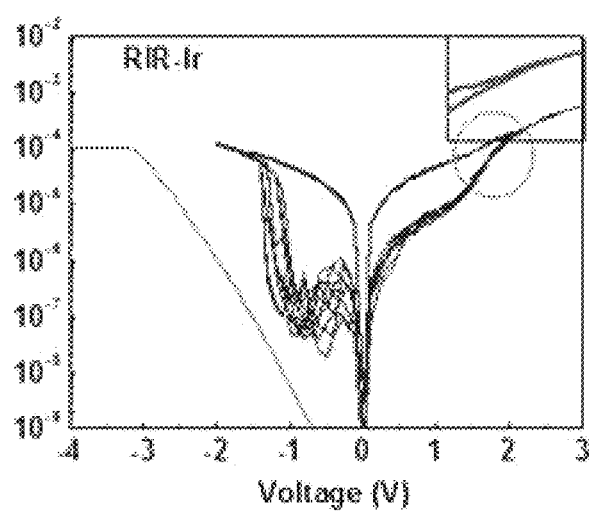
Figure 2E:
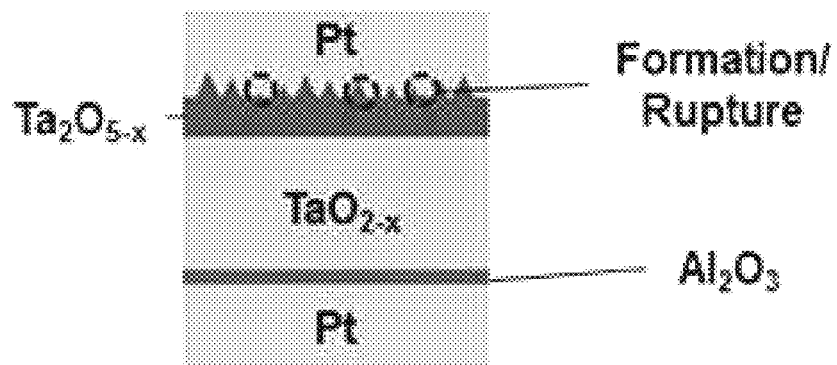
Figure 2F:
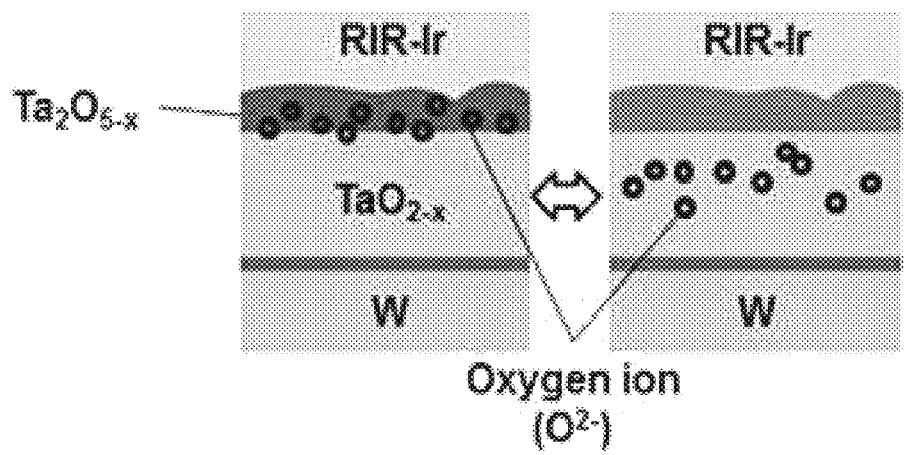

FIG. 2A is a view illustrating a conventional artificial synapse device, FIG. 2B is a view illustrating an artificial synapse device according to an embodiment of the present invention, FIG. 2C is a graph illustrating resistance characteristics of the conventional artificial synapse device, FIG. 2D is a graph illustrating resistance characteristics of the artificial synapse device according to the embodiment of the present invention, FIG. 2E is a current graph according to the repeated operation of the conventional artificial synapse device, and FIG. 2F is a current graph according to the repeated operation of the artificial synapse device according to the embodiment of the present invention. Here, "RIR" refers to a reduced interface roughness between the second resistance change layer and the iridium electrode according to the embodiment of the present invention.

Referring to FIGS. 2A to 2F, it can be seen that the resistance distribution of the artificial synapse device according to the embodiment of the present invention is smaller than that of the conventional artificial synapse device. In addition, it can be seen that the reliability of the artificial synapse device according to the embodiment of the present invention is enhanced since the variation range of the current value of the artificial synapse device according to the embodiment of the present invention is smaller than that of the conventional artificial synapse device during repeated operation.

FIGS. 3A to 3D are photographs illustrating an artificial synapse device according to an embodiment of the present invention.

Figure 3A:
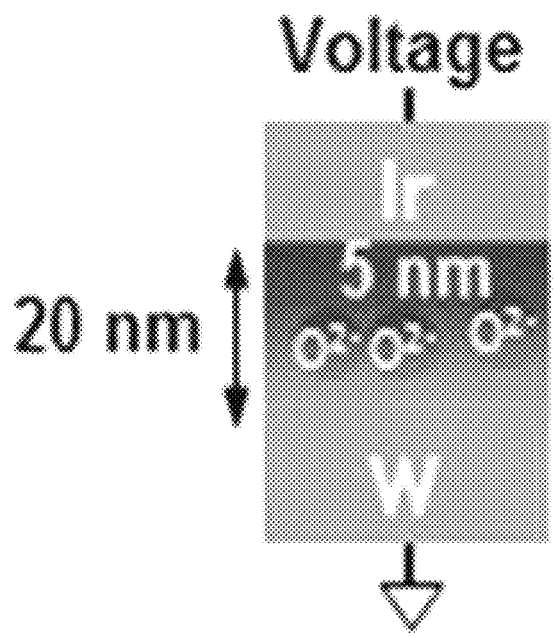
FIGS. 3A to 3D are photographs illustrating an artificial synapse device according to an embodiment of the present invention.

FIG. 3A is a schematic view illustrating an artificial synapse device in which the ratio of its first resistance change layer to its second resistance change layer is 3:1 according to an embodiment of the present invention.

Figure 3B:
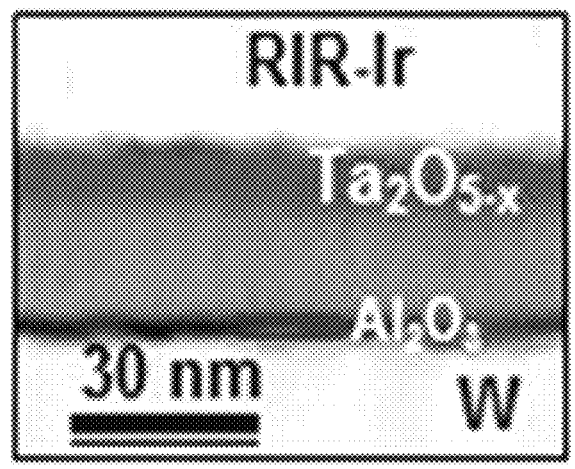

FIG. 3B is an SEM photograph illustrating the artificial synapse device in which the ratio of the first resistance change layer to the second resistance change layer is 3:1 according to the embodiment of the present invention.

Figure 3C:
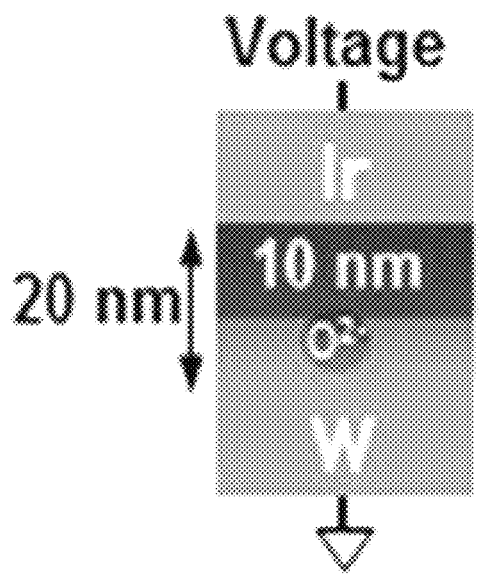

FIG. 3C is a schematic view illustrating an artificial synapse device in which the ratio of its first resistance change layer to its second resistance change layer is 1:1 according to an embodiment of the present invention.

Figure 3D:
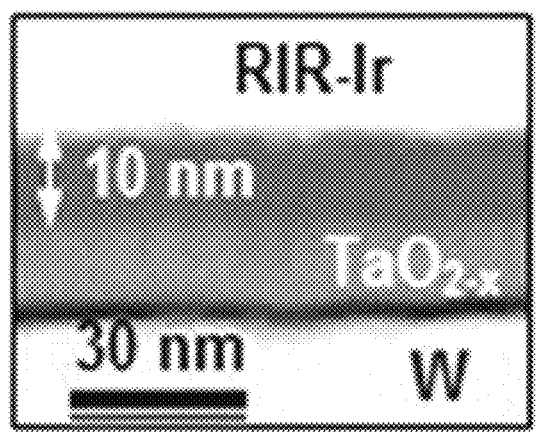

FIG. 3D is an SEM photograph illustrating the artificial synapse device in which the ratio of the first resistance change layer to the second resistance change layer is 1:1 according to the embodiment of the present invention.

FIGS. 4A to 4D are graphs illustrating resistance distribution characteristics according to the thickness ratio of the first resistance change layer and second resistance change layer of the artificial synapse device according to the embodiment of the present invention.

Figure 4A:
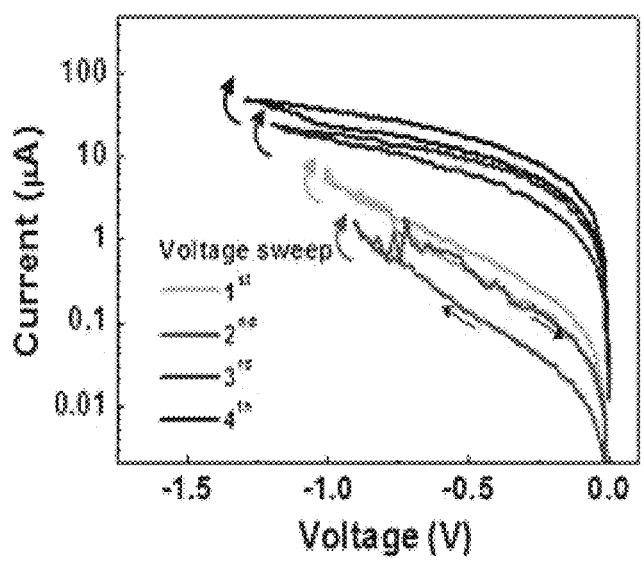
FIGS. 4A to 4D are graphs illustrating resistance distribution characteristics according to the thickness ratio of the first resistance change layer and second resistance change layer of the artificial synapse device according to the embodiment of the present invention.

FIG. 4A is a voltage-current graph according to the number of times of voltage application.

Figure 4B:
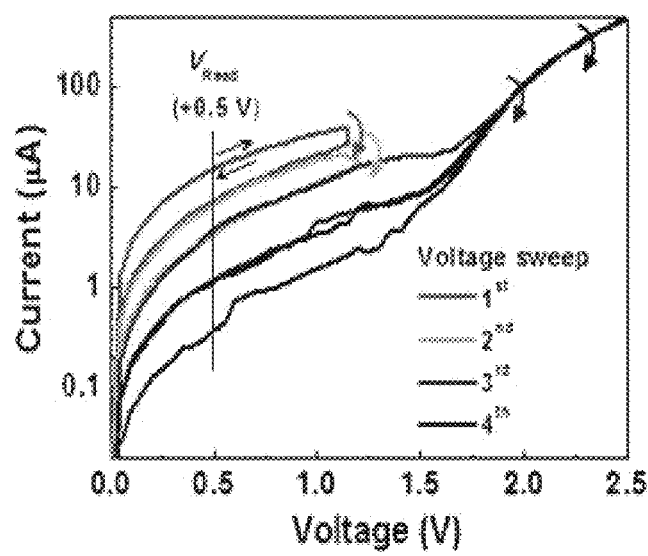

FIG. 4B is a voltage-current graph according to the number of times of voltage application.

Figure 4C:
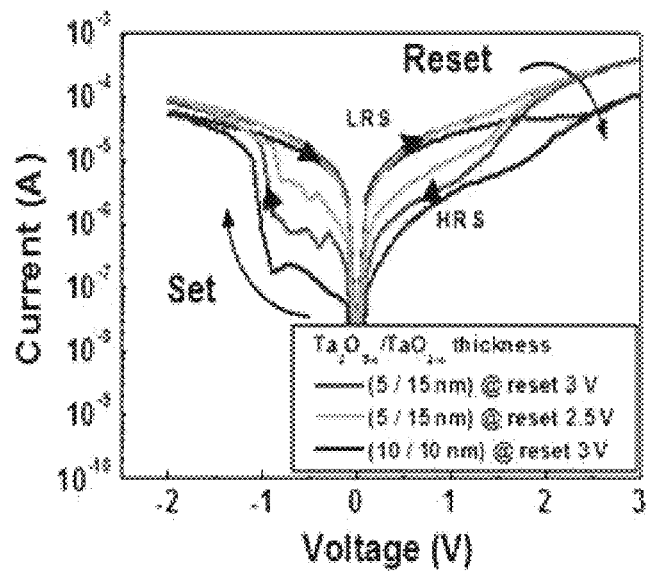

FIG. 4C is a voltage-current graph of the artificial synapse device according to the ratio of the first resistance change layer and the second resistance change layer.

Figure 4D:
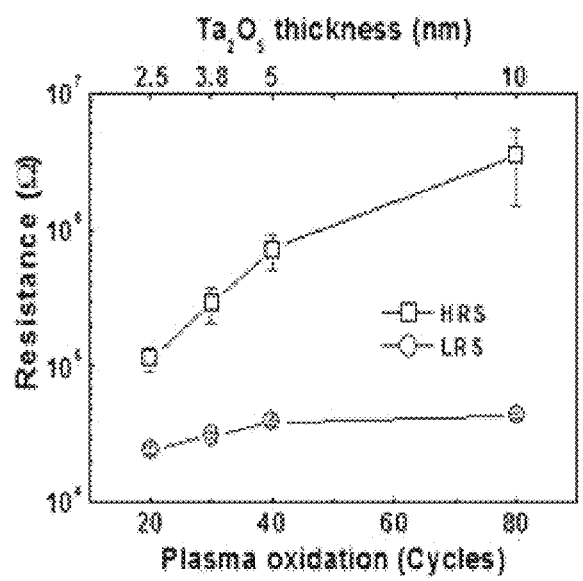

FIG. 4D is a resistance change graph according to the number of cycles.

Here, "HRS" refers to a high-resistance state, and "LRS" refers to a low-resistance state.

Referring to FIGS. 3A to 3D and 4A to 4D, it can be seen that the resistance distribution of the artificial synapse device according to the embodiment of the present invention is reduced as the number of times of operation increases. In addition, it can be seen that the resistance distribution of the device is reduced as the proportion of the second resistance change layer is smaller in the ratio of the first resistance change layer to the second resistance change layer.

FIGS. 5A to 5F are analysis images of an MVR mechanism of the artificial synapse device according to the embodiment of the present invention.

Figure 5A:
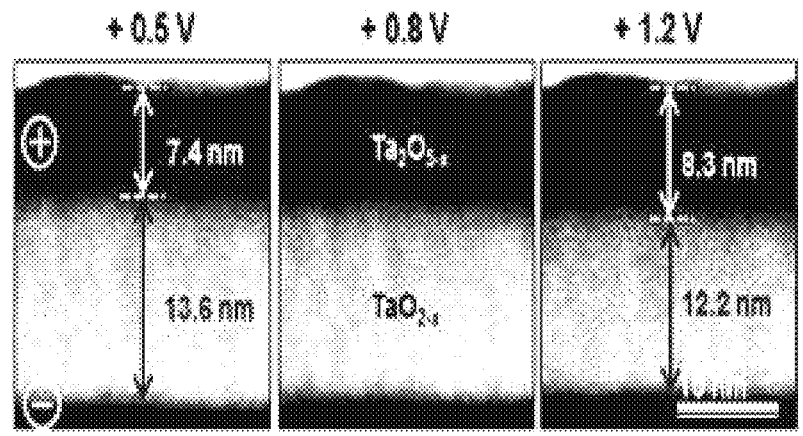
FIGS. 5A to 5F are analysis images of an MVR mechanism of the artificial synapse device according to the embodiment of the present invention.

FIG. 5A is a TEM photograph for each voltage of the artificial synapse device according to the embodiment of the present invention.

Figure 5B:
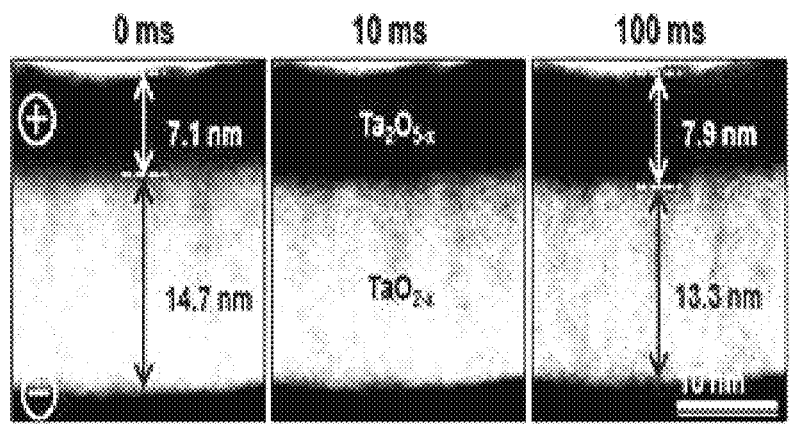

FIG. 5B is a TEM photograph for each voltage application time of the artificial synapse device according to the embodiment of the present invention.

Figure 5C:
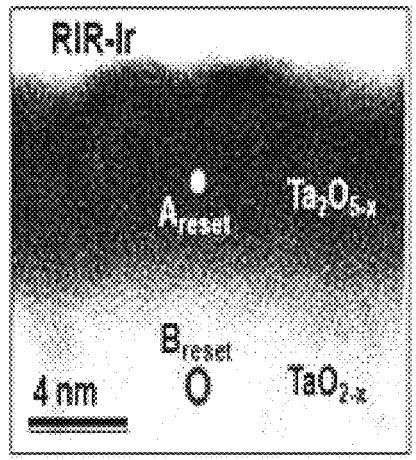

FIG. 5C is a TEM photograph illustrating a reset position (B) of the first resistance change layer and a reset position (A) of the second resistance change layer in the artificial synapse device according to the embodiment of the present invention.

Figure 5D:
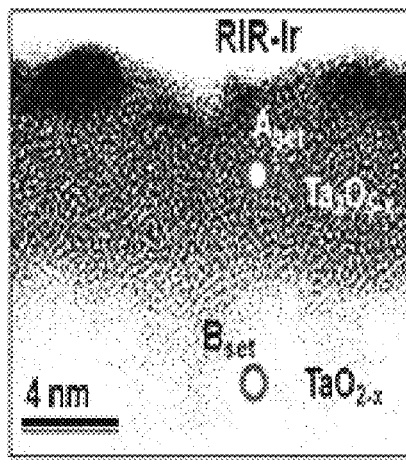

FIG. 5D is a TEM photograph illustrating a set position (B) of the first resistance change layer and a set position (A) of the second resistance change layer in the artificial synapse device according to the embodiment of the present invention.

Figure 5E:
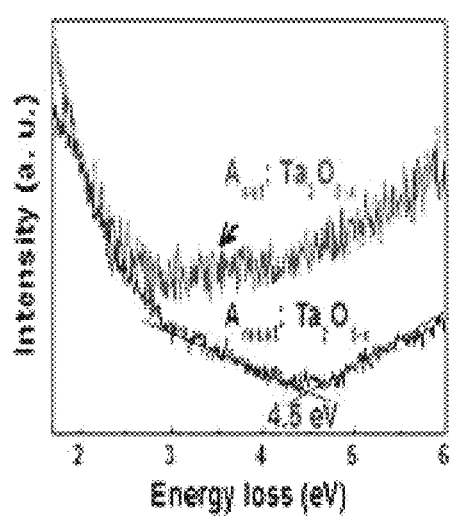

FIG. 5E is a graph illustrating a measured band gap of the second resistance change layer in the set or reset state of the second resistance change layer of the artificial synapse device according to the embodiment of the present invention.

Figure 5F:
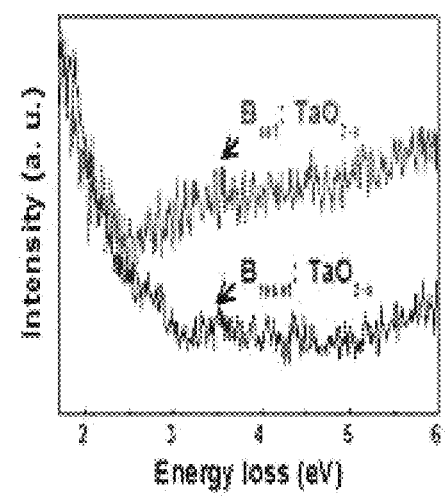

FIG. 5F is a graph illustrating a measured band gap of the second resistance change layer in the set or reset state of the first resistance change layer of the artificial synapse device according to the embodiment of the present invention.

Here, "RIR" refers to a reduced interface roughness between the second resistance change layer and the iridium electrode according to the embodiment of the present invention.

Referring to FIGS. 5A to 5F, FIGS. 5A and 5B are TEM photographs illustrating that the thickness of the second resistance change layer is changed depending on the set or reset voltage, and it can thus be seen that oxygen ions or oxygen vacancies migrate according to the current applied to the artificial synapse device according to the embodiment of the present invention.

Referring to FIGS. 5C, 5D, 5E, and 5F, it can be seen that the first resistance change layer and second resistance change layer of the artificial synapse device according to the embodiment of the present invention have different band gaps according to the set or reset state thereof. This means that the artificial synapse device according to the embodiment of the present invention can function as a synapse mimicking device.

Figure 6A:
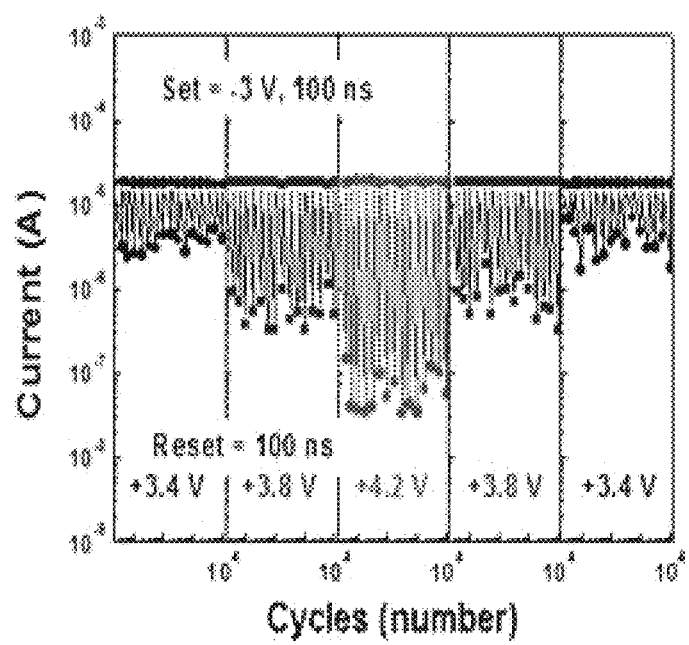
FIGS. 6A to 6C are analysis graphs of MVR characteristics of the artificial synapse device according to the embodiment of the present invention.
Figure 6B:
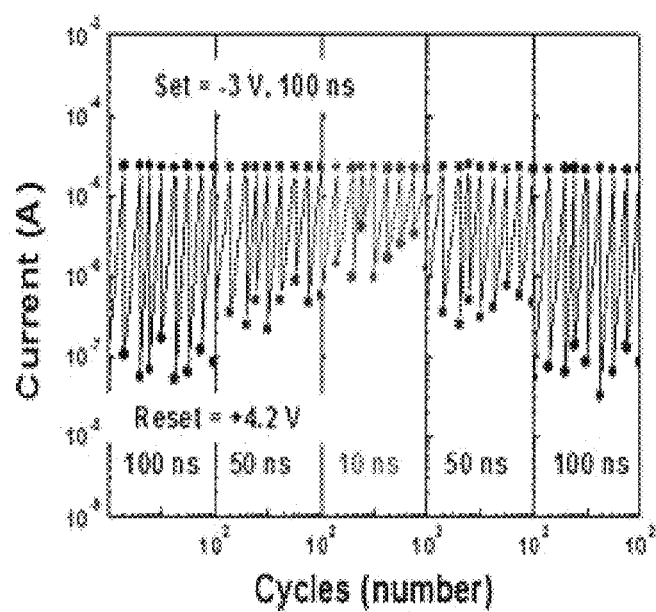
Figure 6C:
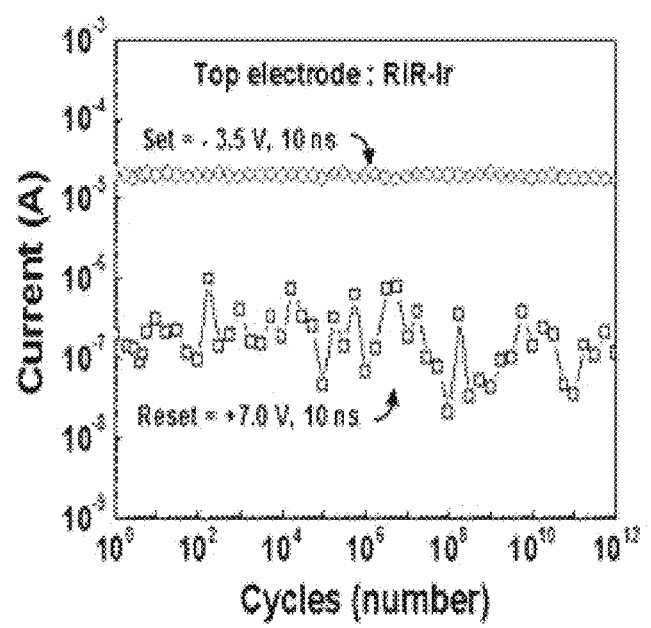

FIGS. 6A to 6C are analysis graphs of MVR characteristics of the artificial synapse device according to the embodiment of the present invention.

FIG. 6A is a graph illustrating a variation in current according to the number of times of repeated operation under a set condition of −3 V and 100 ns and a reset condition of 100 ns and different voltages in the artificial synapse device according to the embodiment of the present invention.

FIG. 6B is a graph illustrating a variation in current according to the number of times of repeated operation under a set condition of −3 V and 100 ns and a reset condition of +4.2 V and different reset times in the artificial synapse device according to the embodiment of the present invention.

FIG. 6C is a graph illustrating repetitive implementation characteristics of the artificial synapse device according to the embodiment of the present invention. Here, "RIR" refers to a reduced interface roughness between the second resistance change layer and the iridium electrode according to the embodiment of the present invention.

Referring to FIGS. 6A to 6C, it can be seen that the thickness of the first resistance change layer marked with $TaO_{2-x}$ and the thickness of the second resistance change layer marked with $Ta_2O_{5-x}$ are changed and their resistance values are changed depending on the voltage intensity or voltage application time thereof. In addition, it can be seen that the artificial synapse device according to the embodiment of the present invention exhibits reproducibility within a certain range even when it is repeatedly driven 100 times to $10^{12}$ times.

Figure 7:
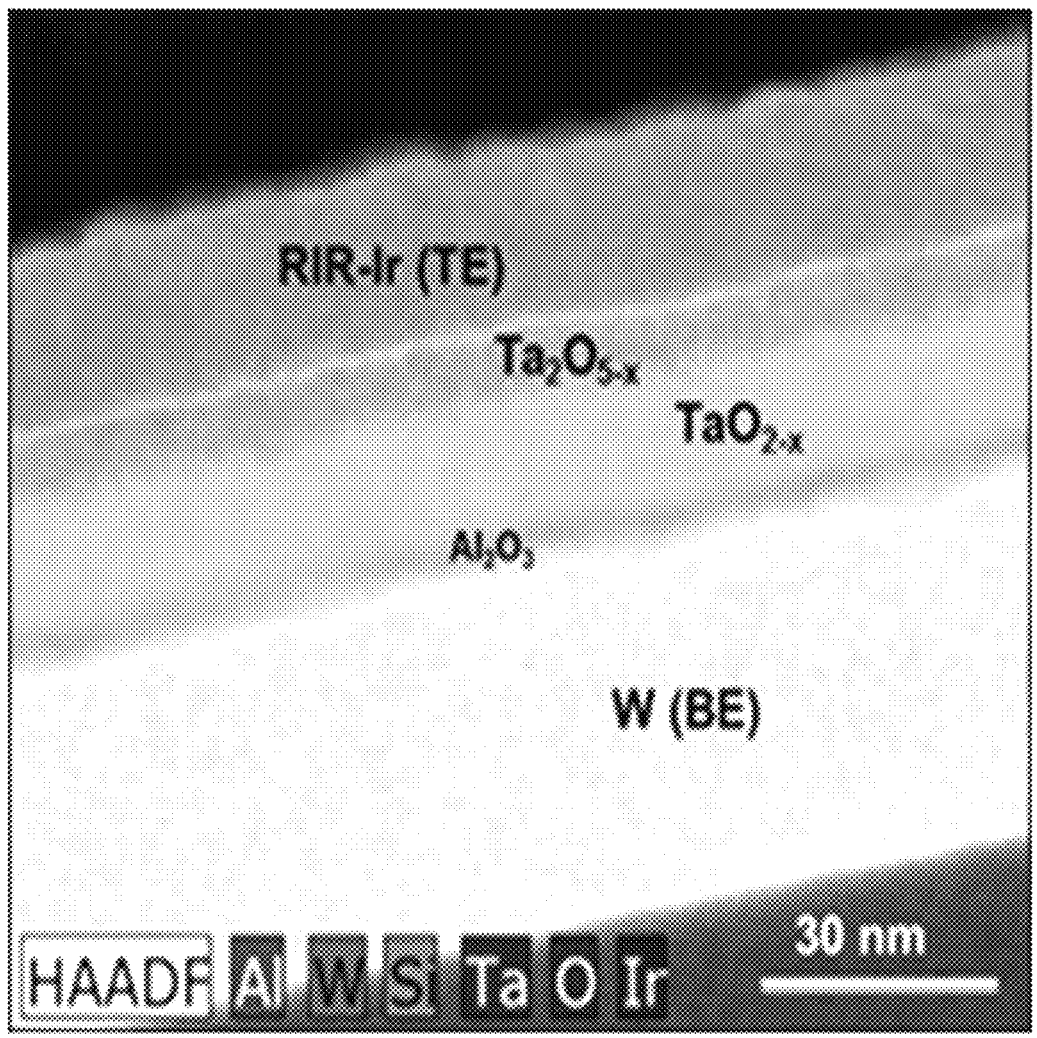
FIG. 7 is an EDS analysis photograph of an artificial synapse device according to an embodiment of the present invention.

FIG. 7 is an EDS analysis photograph of an artificial synapse device according to an embodiment of the present invention.

Referring to FIG. 7, the artificial synapse device according to the embodiment of the present invention may include a base electrode (BE) as a first electrode made of tungsten (W), an $Al_2O_3$ tunneling barrier layer disposed on the first electrode, a $TaO_{2-x}$ first resistance change layer disposed on the tunneling barrier layer, a $Ta_2O_{5-x}$ second resistance change layer disposed on the first resistance change layer, and an iridium (Ir) electrode as a top electrode (TE) disposed on the second resistance change layer. Here, "RIR" refers to a reduced interface roughness between the second resistance change layer and the iridium electrode according to the embodiment of the present invention.

In the case where an artificial synapse device is manufactured by the method of manufacturing an artificial synapse device according to the embodiment of the present invention, it is possible to enhance the reliability of the artificial synapse device by reducing the resistance distribution of the artificial synapse device manufactured by forming oxygen vacancies instead of filaments.

In the case where an artificial synapse device is manufactured by the method of manufacturing an artificial synapse device according to the embodiment of the present invention, it is possible to provide the artificial synapse device having a multiple resistance value through migration of oxygen ions.

In accordance with exemplary embodiments of the present invention, it is possible to provide an artificial synapse device having oxygen ion filaments therein.

In accordance with exemplary embodiments of the present invention, it is possible to reduce the MVR distribution of the device.

In accordance with exemplary embodiments of the present invention, it is possible to improve the resistance distribution of the device.

In accordance with exemplary embodiments of the present invention, it is possible to enhance the reliability of the device.

The present invention is not limited to the above effects, and it should be understood that the present invention includes all effects which can be inferred from the detailed description of the present invention or the configuration of the invention defined by the appended claims.

The above-mentioned embodiments of the present invention are merely examples, and it will be understood by those skilled in the art that various modifications may be made without departing from the spirit and scope or essential features of the invention. Therefore, it should be understood that the embodiments described above are for purposes of illustration only in all aspects and are not intended to limit the scope of the present invention. For example, each component described in a single form may be implemented in a distributed form, and similarly, components described in the distributed form may be implemented in a combined form.

The scope of the present invention is defined by the appended claims, and it should be construed that all modifications or variations derived from the meaning, scope, and equivalent concept of the claims fall within the scope of the invention.

What is claimed is:

1. A method of manufacturing an artificial synapse device, comprising:
    forming a first electrode on a substrate;
    forming a first resistance change layer on the first electrode;
    forming an upper region of the first resistance change layer as a second resistance change layer by oxygen plasma treatment on the first resistance change layer; and
    forming an iridium (Ir) electrode on the second resistance change layer by sputtering in an atmosphere of argon gas and a small amount of oxygen gas.

2. The method according to claim 1, wherein an artificial synapse device is supplied with oxygen ions by the small amount of oxygen gas during the formation of the iridium electrode.

3. The method according to claim 1, wherein the forming an iridium electrode is performed by mixing argon gas with oxygen gas, the partial pressure of which to be 0.1% to 5%.

4. The method according to claim 1, wherein the forming a first electrode is performed by chemical vapor deposition, thermal vacuum treatment, sputtering, or electron beam treatment.

5. The method according to claim 1, wherein the first electrode comprises platinum (Pt) or tungsten (W).

6. The method according to claim 1, wherein the forming a first resistance change layer is performed by chemical vapor deposition, thermal vacuum treatment, sputtering, or electron beam treatment.

7. The method according to claim 1, wherein the first resistance change layer comprises $TiO_2$, $NiO$, $Nb_2O_6$, $HfO_2$, $Al_2O_3$, $V_2O_5$, or $TaO_{2-a}$, where a is 0 (zero) to 2.

8. The method according to claim 1, wherein when the first resistance change layer is $TaO_{2-a}$, the second resistance change layer is $Ta_2O_{5-a}$, where a is 0 (zero) to 2.

9. The method according to claim 1, wherein the forming a second resistance change layer is performed by mixing argon gas with oxygen gas, the partial pressure of which to be 1% to 5%.

10. The method according to claim 1, further comprising forming a tunneling barrier layer on the first electrode between the forming a first electrode on a substrate and the forming a first resistance change layer on the first electrode.

11. The method according to claim 10, wherein the forming a tunneling barrier layer is performed by chemical vapor deposition, thermal vacuum treatment, sputtering, or electron beam treatment.

12. The method according to claim 10, wherein the tunneling barrier layer comprises $TiO_x$, $Ti_xNO_y$, $HfO_x$, $Hf_xO_y$, $AlO_x$, $Al_xO_y$, $TaO_x$, $Ta_xNO_y$, $VO_x$, $V_xO_y$, $Nb_xO_y$, $NbO_x$, $Fe_xO_y$, $FeO_x$, $W_xO_y$, or $WO_x$, where each of x and y is a real number greater than 0 (zero).

13. The method according to claim 1, wherein in the forming an iridium electrode, oxygen ions supplied by the oxygen gas change resistance values of the first resistance change layer and second resistance change layer while migrating therebetween according to a voltage or a current applied thereto.

14. An artificial synapse device manufactured by the method according to claim 1.

15. A method of manufacturing an artificial synapse device, comprising:
    forming a first electrode on a substrate;
    forming a resistance change layer on the first electrode; and
    forming an iridium (Ir) electrode on the resistance change layer by sputtering in an atmosphere of argon gas and a small amount of oxygen gas,
    wherein the forming an iridium electrode is performed by mixing argon gas with oxygen gas, the partial pressure of which to be 0.1% to 5%.

16. The method according to claim 15, wherein the resistance change layer comprises a metal oxide.

* * * * *